United States Patent [19]

Yamasaki

[11] Patent Number: 4,803,445

[45] Date of Patent: Feb. 7, 1989

[54] VARIABLE FREQUENCY OSCILLATOR

[75] Inventor: Richard G. Yamasaki, Torrance, Calif.

[73] Assignee: Silicon Systems, Inc., Tustin, Calif.

[21] Appl. No.: 41,767

[22] Filed: Apr. 22, 1987

[51] Int. Cl.[4] .............................................. H03K 3/281
[52] U.S. Cl. ............................ 331/177 R; 331/113 R
[58] Field of Search ................... 331/10, 16, 111, 143, 331/153, 172, 177 R, 177 V, 108 R, 25, 113 R; 307/480, 527, 529; 328/72, 73, 74, 75; 375/106, 108, 111, 112, 120; 358/17, 148, 150; 360/51; 364/67, 176

[56] References Cited

U.S. PATENT DOCUMENTS

4,633,488 12/1986 Shaw .................................. 328/72 X
4,692,717 9/1987 Ouyang et al. ..................... 331/111

Primary Examiner—Eugene R. Laroche
Assistant Examiner—Robert J. Pascal
Attorney, Agent, or Firm—Hecker & Harriman

[57] ABSTRACT

A variable frequency oscillator (VFO) providing a plurality of timing signals set by an external resistor is described. The single external resistor is utilized to set the center frequency of the VFO. The VFO is comprised of a voltage controlled oscillator (VCO), analog divider, and a plurality of current mirrors. The timing currents of the VCO are set by the external resistor and are independent of the control voltage Vc of the VCO. The VFO gain is independent of control voltage for improved control of the open loop gain. The timing voltage swing is inversely proportional to the control voltage but is independent of the timing currents. Current mirrors are coupled to the external resistor and the timing current to provide a plurality of timing signals.

9 Claims, 2 Drawing Sheets

VARIABLE FREQUENCY OSCILLATOR

BACKGROUND OF THE INVENTION

1. Field of the Invention

This invention relates to the field of variable frequency oscillators.

2. Background Art

Many integrated circuit applications utilize a variable frequency oscillator (VFO) to provide timing signals to the circuit. In some applications, the VFO is used with a phase locked loop (PLL) as, for example, in connection with a data synchronizer. The center frequency of a VFO is set by controlling the charging currents to the timing capacitor of a voltage controlled oscillator (VCO). In the prior art, the charging currents were made proportional to, and thus controlled by, the VCO control voltage Vc.

In PLL applications, the gain of the VFO should be independent of the control voltage Vc. In this manner, the open loop gain of the VFO will not vary with changes in Vc. This reduces loop stability problems caused when the gain is dependent on the control voltage.

In certain instances, it is desired to utilize the VCO charging currents to control a plurality of timing signals in addition to controlling the center frequency of the VFO. Under such circumstances, however, the control voltage Vc cannot be used to control the charging currents as well as additional timing signals without the use of a plurality of external control resistors. A single resistor solution is not possible when the timing currents are controlled by the control voltage Vc.

Therefore, it is desired to provide a VFO in which a single external resistor is utilized to set the center frequency and a plurality of timing signals.

It is a further object of the present invention to provide a VFO in which a single external resistor is utilized to control center frequency and the VFO gain (timing constant) is independent of control voltage.

It is still another object of the present invention to provide a VFO whose center frequency can be set by a single external resistor which can be changed for a wide range of timing requirements.

It is yet another object of the present invention to provide a VFO utilizing a single external resistor for better setting accuracy.

SUMMARY OF THE PRESENT INVENTION

A variable frequency oscillator (VFO) providing a plurality of timing signals set by an external resistor is described. The single external resistor is utilized to set the center frequency of the VFO. The VFO is comprised of a voltage controlled oscillator (VCO) analog divider, and a plurality of current mirrors. The timing currents of the VCO are set by the external resistor and are independent of the control voltage Vc of the VCO. The VFO gain is independent of control voltage for improved control of the open loop gain. The timing voltage swing is inversely proportional to the control voltage but is independent of the timing currents. Current mirrors are coupled to the external resistor and the timing current to provide a plurality of timing signals.

DETAILED DESCRIPTION OF THE PRESENT INVENTION

A variable frequency oscillator controlled by a single external resistor is described. In the following description, numerous specific details are set forth in order to provide a more thorough understanding of the present invention. It will be obvious, however, to those skilled in the art, that the present invention may be practiced without these specific details. In other instances, well known features have not been described in detail in order not to unnecessarily obscure the present invention.

The variable frequency oscillator (VFO) of the present invention is particularly useful in integrated circuit technology. The center frequency of the VFO is set by a single external resistor. This external resistor allows for improved setting accuracy, reduced process variations, and can be changed for a wide range of timing requirements.

The VFO is used in a phase locked loop (PLL) and the VFO center frequency, f, is given by:

$$f = (KI)/(CdV)$$

where,

I = timing current
C = timing capacitor
dV = timing voltage swing
K = timing constant The VFO frequency is controlled by varying the timing voltage swing dV. An analog divider is utilized so that dV is inversely proportional to a control voltage Vc. Thus, the VFO frequency is given by:

$$f = (KIVc)/C$$

Therefore, the VFO gain, KVFO is given by:

$$KVFO = (dw)/(dVC) = (2\pi KI)/C$$

Thus, KVFO is independent of the control voltage Vc. This reduces the PLL gain variation and aids in optimizing the PLL performance.

The present invention has particular application to data recovery and data encoding for storage systems. In the preferred embodiment, the present invention is utilized as part of a data synchronizer for use with disk drive read/write applications. A number of timing signals are required in such applications, for example, an enable gate signal to a phase detector such as is described in copending U.S. patent application Ser. No. 041,728, entitled "Method and Apparatus for Generating a Decode Window" filed on Apr. 22, 1987 and assigned to the assignee of the present invention. In addition, a preamble detect timing signal is required to initiate preamble detect circuitry for decoding (read) applications. However, the VFO of the present invention has equal application wherever it is desired to set center frequency by means of a single external resistor.

Figure 1:
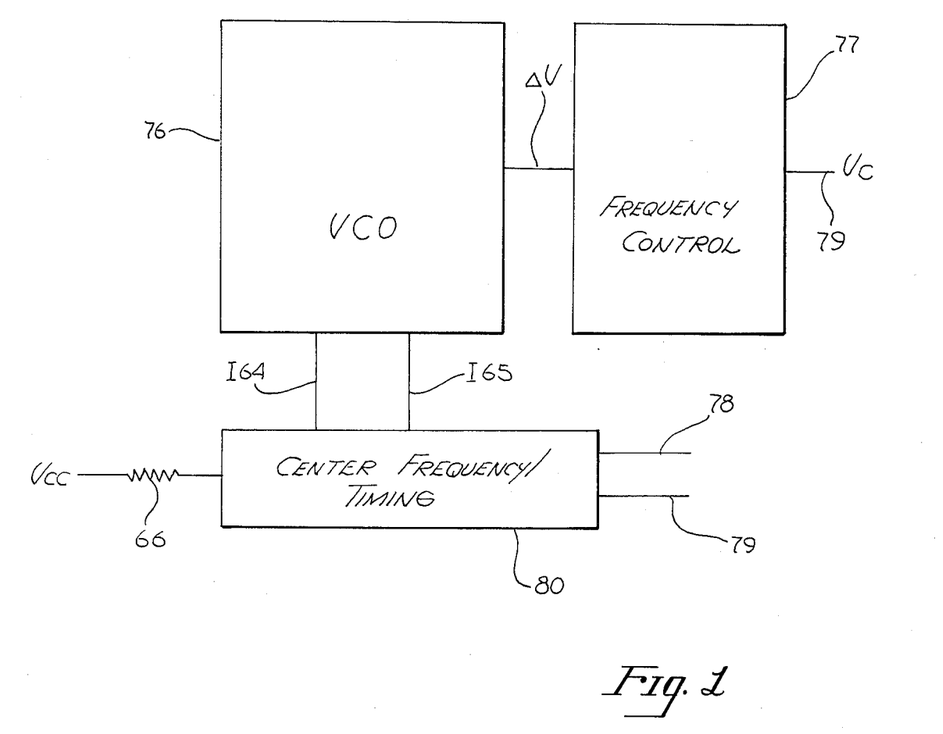
FIG. 1 is a block diagram illustrating the present invention.

FIG. 1 illustrates a block diagram of the present invention. The VFO is made up of a voltage controlled oscillator (VCO) 76, a frequency controller 77, and a center frequency/timing controller 80. An external resistor 66 coupled to a supply voltage VCC is utilized to set the center frequency of the VCO and control timing signals 78 and 81.

A center frequency of VCO 76 is set by timing currents I64 and I65. Currents I64 and I65 are typically identical, but, may, in some cases, be differentially controlled. Currents I64 and I65 are outputted by center frequency/timing controller 80 and are set by setting the value of external resistor 66. In the preferred embodiment, current mirrors are utilized for the center frequency/timing controller 80 but any suitable means may be employed without departing from the scope of the present invention.

Frequency controller 77 is coupled to a control voltage Vc 79 which is used to control the timing voltage swing dV of the VCO 76. As noted previously, it is contemplated that the present invention may be utilized in a phase locked loop. In the preferred embodiment of the present invention, frequency controller 77 is comprised of an analog divider such that the timing voltage swing is inversely proportional to the control voltage Vc. However, any suitable means for establishing dV may be utilized as long as timing currents I64 and I65 are independent of control voltage Vc.

Still referring to FIG. 1, by utilizing a single external resistor 66 to set center frequency and provide timing signals 78 and 81, these timing signals are not affected by changes in control voltage VC 79. This obviates the need for a plurality of external resistors and greatly simplifies control, accuracy and application of the present invention.

Figure 2:
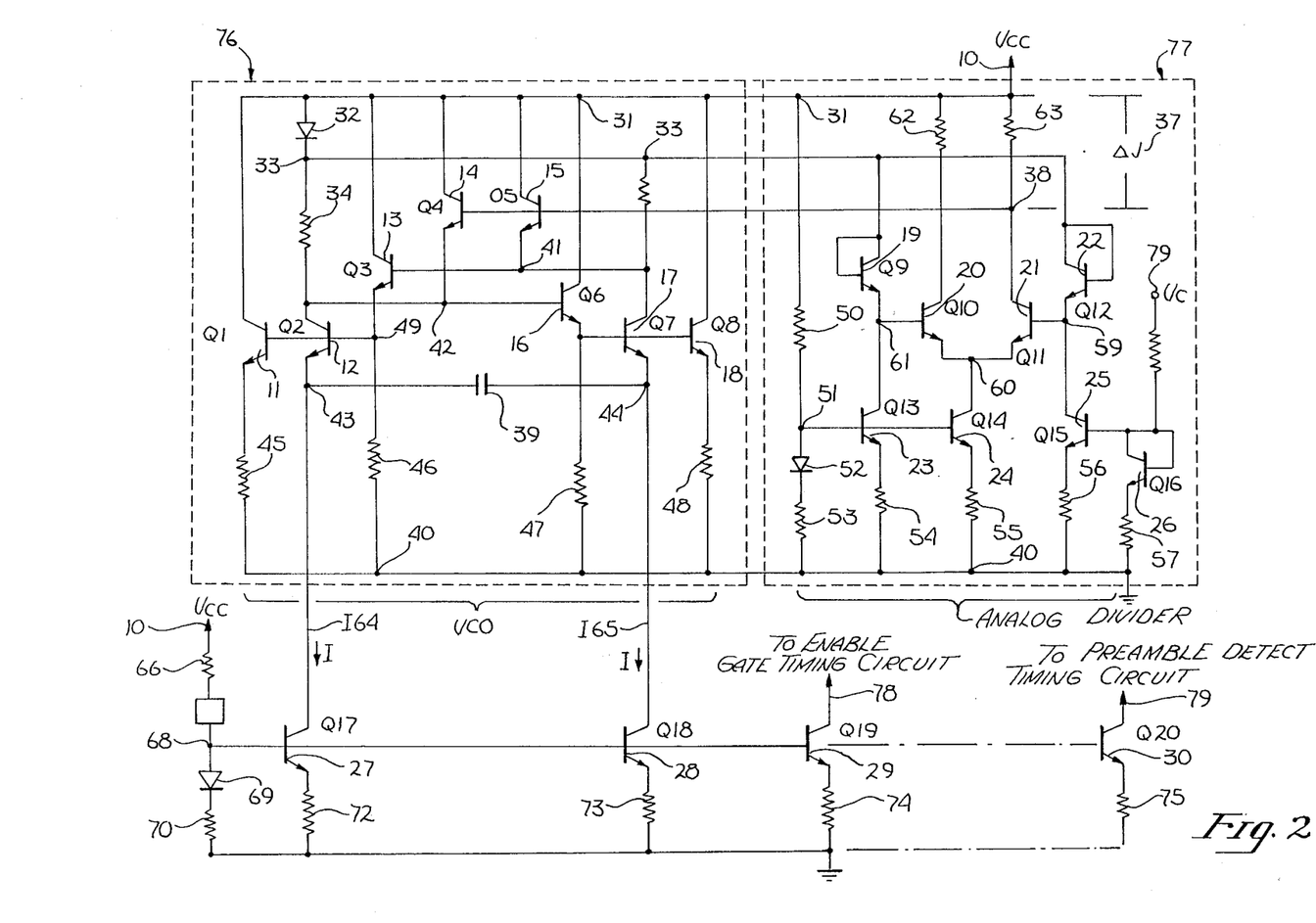
FIG. 2 is a circuit diagram illustrating the preferred embodiment of the present invention.

The circuitry of the preferred embodiment of the present invention is illustrated in FIG. 2. The VFO consists of voltage control oscillator (VCO) generally indicated by dashed enclosure 76, and analog divider generally indicated by dashed enclosure 77, and a plurality of current mirrors for setting timing current, and other timing signals such as enable gate current, and, if desired, preamble detect timing circuit.

A supply voltage VCC 10 is coupled through node 31 to VCO 76. Node 31 is coupled to the collector of transistors 11, 13– 16, and 18. Node 31 is coupled through diode 32 to node 33 which is coupled through resistor 34 to the collector of transistors 12 at node 42. Node 33 is coupled through resistor 35 to the collector of transistor 17 at node 41. The voltage swing dV 37 is measured across resistor 63 at node 38. Node 31 is coupled through resistor 63 to node 38. Node 38 is also coupled to the base of transistors 14 and 15. The emitter of transistor 11 is coupled through node 45 to ground at node 40. The emitter of transistor 12 is coupled to node 43. The emitter of transistor 13 is coupled to node 49 (the base of transistors 11 and 12) and through resistor 46 to ground node 40.

The emitter of transistor 14 is coupled to node 42, the base of transistor 16. The emitter of transistor 15 is coupled to node 41, the base of transistor 13. The emitter of transistor 16 is coupled to the bases of transistor 17 and transistor 18 and through resistor 47 to ground node 40. The emitter of transistor 17 is coupled to node 44 and the emitter of transistor 18 is coupled through resistor 48 to ground node 40.

Timing capacitor 39 is coupled between nodes 43 and 44. Output currents I64 and I65 are taken from nodes 43 and 44 respectively.

Supply voltage VCC 1 at node 31 supplies the analog divider 77. Node 31 is coupled through resistor 62 to the collector of transistor 20. Node 31 is also coupled through resistor 63 to node 38, thereby establishing dV 37. Node 38 is coupled to the collector of transistor 21. The emitters of transistors 20 and 21 are coupled to node 60, the collector of transistor 24.

Node 31 (VCC 10) is also coupled through resistor 50 to node 51. Node 51 is coupled to the base of transistors 23 and 24. Node 51 is also coupled through diode 52 and resistor 53 to ground node 40. The emitters of transistor 23–26 are coupled through resistors 54–57 respectively to ground node 40.

The collector of transistor 23 is coupled at node 61 to the base of transistor 20 and the emitter of transistor 19. The base coupled collector of transistor 19 is also coupled to node 33. Node 33 is coupled to the base coupled collector of transistor 22. The emitter of transistor 22 is coupled at node 59 to the base of transistor 21 and to the collector of transistor 25.

A control voltage Vc 79 is coupled through resistor 58 to the base of transistor 25 and to the base coupled collector of transistor 26. The emitter of transistor 26 is coupled through resistor 57 to ground node 40.

Supply voltage VCC 1 is coupled through external resistor 66 at pad 67 to node 68. Node 68 is coupled through diode 69 and transistors 70 to ground node 71. Node 68 is also coupled to the base of transistors 27–30. The emitter of transistors 27–30 is coupled through resistors 72–75 respectively to ground node 71. The collector of transistor 27 is coupled to current I64 from node 43 of VCO 76. The collector of transistor 28 is coupled to current I65 from node 44 of VCO 76.

The collector of transistor 29 is coupled to the enable gate timing circuit. The collector of transistor 30 is coupled to the preamble detect timing circuit.

External resistor 66 is utilized to set the current in current mirror transistors 27–30. Transistors 27 and 28 supply timing currents I64 and I65 to VCO timing capacitor 39. Transistors 19–26 form an analog divider so that voltage swing dV 37 at node 38 is inversely proportional to control voltage Vc 79.

In general, currents I64 and I65 are equal. However, if desired, the present invention may be utilized with window shifting circuitry in which currents I64 and I65 are differentially controlled. Such window shifting circuitry is described in U.S. patent application Ser. No. 041,728, filed on Apr. 22, 1987 entitled "Method and Apparatus for Generating a Data Recovery Window" and assigned to the assignee of the present invention.

As stated previously, external resistor 66 is utilized to set the center frequency of the VFO by setting the currents I64 and I65. The center frequency is the frequency of operation of the VCO 76 with Vc at the center of its operating range. In operation, the VFO is part of a phase locked loop in which an error signal is generated whenever there is a phase difference between the operating frequency of the VCO and the input signal to the loop. This generates an error signal and control voltage 79 is utilized to control the timing voltage swing dV 37 to track the input signal to the loop. By making currents I64 and I65 independent of control voltage Vc 79, other timing signals controlled by external resistor 66 are not affected by changes in the timing voltage swing during phase locking operations. This allows a plurality of timing signals to be controlled by a single external resistor.

Thus, a variable frequency oscillator providing a plurality of timing signals in which a single external resistor is utilized to control center frequency and the additional timing signals has been described.

I claim:

1. A circuit for providing a variable frequency oscillator (VFO) comprising:
   oscillating means having a center frequency and outputting a first clock signal;
   first control means coupled to a control voltage and said oscillating means for controlling said first clock signal;
   second control means coupled to said oscillating means for controlling said center frequency and outputting a plurality of second clock signals, said second control means independent of said first control means.

2. The circuit of claim 1 wherein said oscillating means comprises a voltage controlled oscillator (VCO).

3. The circuit of claim 1 wherein said first control means comprises an analog divider for generating a timing voltage swing dependent on said control voltage.

4. The circuit of claim 1 wherein said second control means comprises an external resistor coupled to a supply voltage and to a plurality of current mirrors, first and second of said plurality of current mirrors supplying timing current to said oscillating means, said timing current establishing said center frequency in said oscillating means, said timing current independent of said control voltage.

5. The circuit of claim 1 wherein said VFO has a gain independent of said control voltage.

6. A circuit for providing a variable frequency oscillator (VFO) comprising:
   a voltage controlled oscillator (VCO) having a center frequency established by a timing current, said VCO outputting a first clock signal dependent on a timing voltage swing;
   first control means coupled to said VCO and to a control voltage, said first control means for setting said timing voltage swing, said timing voltage swing dependent on said control voltage;
   second control means coupled to said VCO, said second control means for setting said timing current for establishing said center frequency, said second control means outputting a plurality of timing signals.

7. The circuit of claim 6 wherein said first control means comprises an analog divider such that said timing voltage swing is inversely proportional to said control voltage.

8. The circuit of claim 7 wherein said second control means comprises an external resistor coupled to a supply voltage and a plurality of current mirrors, first and second of said current mirrors controlling said timing current.

9. The circuit of claim 8 wherein said VFO has a gain independent of said control voltage.

* * * * *

REEXAMINATION CERTIFICATE (2084th)

United States Patent [19]

Yamasaki

[11] B1 4,803,445

[45] Certificate Issued Sep. 7, 1993

[54] VARIABLE FREQUENCY OSCILLATOR

[75] Inventor: Richard G. Yamasaki, Torrance, Calif.

[73] Assignee: Silicon Systems, Inc., Tustin, Calif.

Reexamination Request:
No. 90/002,791, Jul. 21, 1992

Reexamination Certificate for:
Patent No.: 4,803,445
Issued: Feb. 7, 1989
Appl. No.: 41,767
Filed: Apr. 22, 1987

[51] Int. Cl.$^5$ .......................................... H03K 3/281
[52] U.S. Cl. ............................ 331/177 R; 331/113 R
[58] Field of Search ......................... 331/177 R, 177 V

[56] References Cited

U.S. PATENT DOCUMENTS

| | | | |
|---|---|---|---|
| 3,904,989 | 9/1975 | Cordell | 331/113 R |
| 4,068,188 | 1/1978 | Yokoyama | 331/8 |
| 4,336,508 | 6/1982 | Cole et al. | 331/113 R |
| 4,494,080 | 1/1985 | Call | 331/8 |
| 4,809,088 | 2/1989 | Lofgren et al. | 360/31 |
| 4,922,141 | 5/1990 | Lofgren et al. | 307/595 |

OTHER PUBLICATIONS

Cordell & Garrett, "A Highly Stable VCO for Application in Monolithic Phase-Locked Loops," 10 *IEEE Journal of Solid State Circuits*, No. 6, Dec. 1975, pp. 480–485.
Signetics 564 Data Sheet reprinted in *Design of Phase-Locked Loop Circuits With Experiments* (1978), Howard W. Sams & Co., Inc., Indianapolis, Ind., pp. 175–179.
Barrie Gilbert, "A Versatile Monolithic Voltage-to-Frequency Converter", 11 *IEEE Journal of Solid State Circuits* No. 6, Dec. 1976, pp. 852–864.
Grebene, "The Monolithic Phase-Locked Loop—A Versatile Building Block" *IEEE Spectrum*, Mar. 1971, pp. 38–49.
IEEE Standard Dictionary of Electrical and Electronic Terms 1972, p. 88.
Grebene, "Monolithic Waveform Generation", *IEEE Spectrum*, Apr. 1972, pp. 34–40.
*McGraw-Hill Dictionary of Scientific and Technical Terms* (1984), p. 312.
Sedra, *Microelectronic Circuits* (1982), CBS College Publishing, New York, N.Y., pp. 433–436.
Millman, *Microelectronics*, (1979), McGraw-Hill Book Co, New York, pp. 536–540.
Millman, Microelectronics, pp. 529–533 (1979), pp. 536–540, 572–573, McGraw-Hill, Inc. New York.
Grey, Analysis and Design of Analog Integrated Circuits, pp. 562–563 (1977) John Wiley & Sons, New York.
Glaser, Integrated Circuit Engineering, pp. 639–644 (1977) Addison-Wesley Publishing Co., Menlo Park, Calif.
National SemiConductor Corp. DP8470 Datasheet Apr. 1986.

*Primary Examiner*—Siegfried H. Grimm

[57] ABSTRACT

A variable frequency oscillator (VFO) providing a plurality of timing signals set by an external resistor is described. The single external resistor is utilized to set the center frequency of the VFO. The VFO is comprised of a voltage controlled oscillator (VCO), analog divider, and a plurality of current mirrors. The timing currents of the VCO are set by the external resistor and are independent of the control voltage Vc of the VCO. The VFO gain is independent of control voltage for improved control of the open loop gain. The timing voltage swing is inversely proportional to the control voltage but is independent of the timing currents. Current mirrors are coupled to the external resistor and the timing current to provide a plurality of timing signals.

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1 and 6 are determined to be patentable as amended.

Claims 2–5 and 7–9, dependent on an amended claim, are determined to be patentable.

1. A circuit for providing a variable frequency oscillator (VFO) comprising:

oscillating means having a center frequency and outputting a first clock signal;

first control means coupled to a control voltage and said oscillating means for controlling said first clock signal;

second control means coupled to said oscillating means for controlling said center frequency and outputting a plurality of second clock signals *external to said oscillating means, wherein at least one of said plurality of clock signals is coupled to a timing circuit*, said second control means independent of said first control means.

6. A circuit for providing a variable frequency oscillator (VFO) comprising:

a voltage controlled oscillator (VCO) having a center frequency established by a timing currrent, said VCO outputting a first clock signal dependent on a timing voltage swing;

first control means coupled to said VCO and to a control voltage, said first control means for setting said timing voltage swing, said timing voltage swing dependent on said control voltage;

second control means coupled to said VCO, said second control means for setting said timing current for establishing said center frequency, said second control means outputting a plurality of timing signals *external to said VCO, wherein at least one of said plurality of timing signals is coupled to a timing circuit*.

* * * * *

REEXAMINATION CERTIFICATE (2280th)
United States Patent [19]
Yamasaki

[11] B2 4,803,445
[45] Certificate Issued Apr. 26, 1994

[54] VARIABLE FREQUENCY OSCILLATOR

[75] Inventor: Richard G. Yamasaki, Torrance, Calif.

[73] Assignee: Silicon Systems, Tustin, Calif.

Reexamination Requests:
No. 90/003,160, Aug. 13, 1993

Reexamination Certificate for:
Patent No.: 4,803,445
Issued: Feb. 7, 1989
Appl. No.: 41,767
Filed: Apr. 22, 1987

Reexamination Certificate B1 4,803,445 issued Sep. 7, 1993.

[51] Int. Cl.⁵ .............................................. H03K 3/281
[52] U.S. Cl. ............................. 331/177 R; 331/113 R

[56] References Cited

U.S. PATENT DOCUMENTS

| | | | |
|---|---|---|---|
| Re. 31,174 | 3/1983 | Herth et al. | 123/489 |
| 3,614,309 | 10/1971 | Presti | 178/6.6 DD |
| 3,651,345 | 3/1972 | Lundgreen | 307/273 |
| 3,657,564 | 4/1972 | Hollis | 307/252 K |
| 3,695,107 | 10/1972 | Hertz et al. | 73/290 R |
| 3,720,949 | 3/1973 | Richter | 343/14 |
| 4,068,188 | 1/1978 | Yokoyama | 331/8 |
| 4,463,321 | 7/1984 | Horner | 331/1 R |
| 4,494,021 | 1/1985 | Bell et al. | 307/591 |
| 4,518,901 | 5/1985 | Fukushima et al. | 318/328 |

OTHER PUBLICATIONS

National Semiconductor Corporation DP8470 Data Sheet (Apr. 1986).
Cordell, Robert R. and William G. Garrett, "A Highly Stable VCO for Application in Monolithic Phase-Locked Loops," *IEEE Journal of Solid-State Circuits*, vol. SC-10, No. 6, Dec. 1975, pp. 480-485.
Signetics 564 Data Sheet reprinted in *Design of Phase-Locked Loop Circuits* (1978).
SSi 532 and SSi 534 New Product Bulletin (Nov. 1986).
SSi 532 "Data Synchronizer" Data Sheet (Feb. 1987).
SSi 531 "Data Separator and Write Precompensation Circuit" Data Sheet reprinted in *Silicon Systems Data Book* (Jan. 1986).

*Primary Examiner*—S. H. Grimm
*Agent, Attorney, or Firm*—Hecker & Harriman

[57] ABSTRACT

A variable frequency oscillator (VFO) providing a plurality of timing signals set by a external resistor is described. The single external resistor is utilized to set the center frequency of the VFO. The VFO is comprised of a voltage controlled oscillator (VCO), analog divider, and a plurality of current mirrors. The timing currents of the VCO are set by the external resistor and are independent of the control voltage Vc of the VCO. The VFO gain is independent of control voltage for improved control of the open loop gain. The timing voltage swing is inversely proportional to the control voltage but is independent of the timing currents. Current mirrors are coupled to the external resistor and the timing current to provide a plurality of timing signals.

REEXAMINATION CERTIFICATE ISSUED UNDER 35 U.S.C. 307

NO AMENDMENTS HAVE BEEN MADE TO THE PATENT.

AS RESULT OF REEXAMINATION, IT HAS BEEN DETERMINED THAT:

The patentability of claims 1-9 is confirmed.

* * * * *

US004803445B1

REEXAMINATION CERTIFICATE (3089th)

United States Patent [19]

Yamasaki

[11] B3 4,803,445

[45] Certificate Issued  Dec. 31, 1996

[54] VARIABLE FREQUENCY OSCILLATOR

[75] Inventor: Richard G. Yamasaki, Torrance, Calif.

[73] Assignee: Silicon Systems, Inc., Tustin, Calif.

Reexamination Request:
No. 90/003,909, Aug. 4, 1995

Reexamination Certificate for:
Patent No.: 4,803,445
Issued: Feb. 7, 1989
Appl. No.: 41,767
Filed: Apr. 22, 1987

Reexamination Certificate B2 4,803,445 issued Apr. 26, 1994

Reexamination Certificate B1 4,803,445 issued Sep. 7, 1993

[51] Int. Cl.[6] ............................................. H03K 3/281
[52] U.S. Cl. ................................. 331/177 R; 331/113 R
[58] Field of Search ............................ 331/177 R, 177 V

[56] References Cited

U.S. PATENT DOCUMENTS

| Re. 31,174 | 3/1983 | Herth et al. | 123/489 |
|---|---|---|---|
| 3,582,809 | 6/1971 | Rigby | 331/8 |
| 3,587,002 | 6/1971 | Brown | 331/113 R |
| 3,614,309 | 10/1971 | Presti | 178/616 DD |
| 3,618,131 | 11/1971 | Garde | 331/113 R |
| 3,651,345 | 3/1972 | Lundgreen | 307/273 |
| 3,657,564 | 4/1972 | Hollis | 307/252 K |
| 3,665,343 | 5/1972 | Thompson | 331/113 R |
| 3,695,107 | 10/1972 | Hertz | 73/290 R |
| 3,720,949 | 3/1973 | Richter | 343/14 |
| 3,727,202 | 4/1973 | Fort | 340/174.1 A |
| 3,855,551 | 12/1974 | Ishigaki et al. | 331/113 R |
| 3,857,110 | 12/1974 | Grebene | 331/108 D |
| 3,878,334 | 4/1975 | Halpern | 178/69.5 R |
| 3,886,485 | 5/1975 | Takahashi | 331/111 |
| 3,946,330 | 3/1976 | Takahashi | 331/8 |
| 3,986,145 | 10/1976 | Hongu et al. | 332/16 T |
| 4,015,083 | 3/1977 | Bellisio | 178/69.1 |
| 4,083,019 | 4/1978 | Hamada et al. | 331/113 R |
| 4,231,071 | 10/1980 | Anderson | 360/40 |
| 4,319,200 | 3/1982 | Terwilliger | 331/8 |
| 4,419,634 | 12/1983 | Druegh et al. | 331/117 R |
| 4,463,321 | 7/1984 | Horner | 331/1 R |
| 4,494,021 | 1/1985 | Bell et al. | 307/591 |
| 4,518,901 | 5/1985 | Fukushima et al. | 318/328 |
| 4,567,448 | 1/1986 | Ikeda | 331/25 |
| 4,580,100 | 4/1986 | Suzuki et al. | 360/51 |
| 4,672,597 | 6/1987 | Yamazaki | 369/59 |
| 4,694,261 | 9/1987 | Ewen et al. | 331/57 |
| 4,717,892 | 1/1988 | Hitomi | 331/113 R |
| 4,745,375 | 5/1988 | Suzuki | 331/116 R |
| 4,749,961 | 6/1988 | Kato et al. | 331/14 |
| 4,800,340 | 1/1989 | Maimone et al. | 331/1 A |

OTHER PUBLICATIONS

Mehrotra et al, "A 1 MBIT/SEC CMOS Data Separator and Write Precompensation Circuit for Floppy Disk Drives", IEEE 1986 Custom Integrated Circuits Conference, May 12–15, 1986, pp. 435–438.

Allen G. Bell and Gaetano Borriello, *A Single Chip NMOS Ethernet Controller*, 1983 IEEE International Solid-State Circuits Conference (Feb. 23, 1983).

Allen Lui, *Digital PLL Synchronizes Clocks Simply*, EDN 272 (Aug. 9, 1984).

(List continued on next page.)

*Primary Examiner*—Siegfried H. Grimm

[57] ABSTRACT

A variable frequency oscillator (VFO) providing a plurality of timing signals set by an external resistor is described. The single external resistor is utilized to set the center frequency of the VFO. The VFO is comprised of a voltage controlled oscillator (VCO), analog divider, and a plurality of current mirrors. The timing currents of the VCO are set by the external resistor and are independent of the control voltage Vc of the VCO. The VFO gain is independent of control voltage for improved control of the open loop gain. The timing voltage swing is inversely proportional to the control voltage but is independent of the timing currents. Current mirrors are coupled to the external resistor and the timing current to provide a plurality of timing signals.

OTHER PUBLICATIONS

Herb Schneider, *Disk-Separator EC Eases Encoding/Decoding Tasks*, EDN 193 (Aug. 18, 1983).

Henryk Szejnwald and Phil Brooks, *Simplify Hard-Disk Interfaces With a VLSI Controller*, EDN 133 (Nov. 24, 1982).

Karen N. Collins, *Single-Chip Interface Eases Data Separator Design in Hard-Disk Control Circuits*, Electronic Design 145 (Mar. 6, 1986).

Dave Bursky, *Disk Controller IC Packs Analog Data Separator*, Electronic Design 133 (Dec. 26, 1985).

Hamid Assarpour, *Floppy-Disk Interface Chip Cuts Parts, Adds Controll*, Electronic Design 207 (Apr. 28, 1983).

Ed Connolly, *Chip Sorts, Synchronizes Data and Clock from Disks*, Electronic Design 230 (Apr. 14, 1983).

M. G. Call and D. R. Grindel, *Automatic Center Frequency Adjustment for Phase-Locked Loops*, IBM Technical Disclosure Bulletin, vol. 26, No. 10A (Mar. 1984).

M. G. Call, et al., *Phase-Locked Loop Center Frequency Adjustment System*, IBM Technical Disclosure Bulletin, vol. 26, No. 8 (Jan. 1984).

Curtis Panasuk, *Focus on Disk Drive Controller Chips*, Electronic Design 107 (Dec. 26, 1985).

Kazuo Kato, et al., *A Low Power Dissipation PPL IC Operating at 128 MHz Clock*, IEEE 1987 Custom Integrated Circuits Conference.

P. J. Bénéteau & A. Evangilisti, *An Improved Emitter-Coupled Multivibrator*, Fairchild Semiconductor Application Data, APP-59 (Feb. 1963).

SSi 531 *Data Separator and Write Precompensation Circuit*, Data Sheet reprinted in *Silicon Systems Data Book* (Jan. 1986).

Fred Horowitz and Winfield Hill, *The Art of Electronics* (1980) Cambridge University Press, NY.

Data Sheet for the NEC 765/7265A published Aug., 1986.

Fig. 1

Fig. 2

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

ONLY THOSE PARAGRAPHS OF THE SPECIFICATION AFFECTED BY AMENDMENT ARE PRINTED HEREIN.

Column 3, lines 39–53:

A supply voltage VCC 10 is coupled through node 31 to VCO 76. Node 31 is coupled to the collector of transistors 11, 13–16, and 18. Node 31 is coupled through diode 32 to node 33 which is coupled through resistor 34 to the collector of [transistors] *transistor* 12 at node 42. Node 33 is coupled through resistor 35 to the collector of transistor 17 at node 41. The voltage swing dV 37 is measured across resistor 63 at node 38. Node 31 is coupled through resistor 63 to node 38. Node 38 is also coupled to the base of transistors 14 and 15. The emitter of transistor 11 is coupled through node 45 to ground at node 40. The emitter of transistor 12 is coupled to node 43. The emitter of transistor 13 is coupled to node 49 (the base of transistors 11 and 12) and through resistor 46 to ground node 40.

Column 3, line 65 to column 4, line 3:

Supply voltage VCC [1] *10* at node 31 supplies the analog divider 77. Node 31 is coupled through resistor 62 to the collector of transistor 20. Node 31 is also coupled through resistor 63 to node 38, thereby establishing dV 37. Node 38 is coupled to the collector of transistor 21. The emitters of transistors 20 and 21 are coupled to node 60, the collector of transistor 24.

Column 4, lines 21–29:

Supply voltage VCC [1] *10* is coupled through external resistor 66 at pad 67 to node 68. Node 68 is coupled through diode 69 and [transistors] *resistor* 70 to ground node 71. Node 68 is also coupled to the base of transistors 27–30. The emitter of transistors 27–30 is coupled through resistors 72–75 respectively to ground node 71. The collector of transistor 27 is coupled to current I64 from node 43 to VCO 76. The collector of transistor 28 is coupled to current I65 from node 44 of VCO 76.

THE DRAWING FIGURES HAVE BEEN CHANGED AS FOLLOWS:

FIG. 1: reference numeral 79 changed to 81. FIG. 2: reference numerals 35, 58, 67 and 71 have been added, and numeral 79 has been changed to 81.

AS A RESULT OF REEXAMINATION, IT HAS BEEN DETERMINED THAT:

Claims 1 and 6 are determined to be patentable as amended.

Claims 2–5 and 7–9, dependent on an amended claim, are determined to be patentable.

1. A circuit for providing a variable frequency oscillator (VFO) comprising:

oscillating means having a center frequency and outputting a first clock signal;

first control means coupled to a control voltage and said oscillating means for controlling said first clock signal;

second control means coupled to said oscillating means for controlling said center frequency and outputting a plurality of [second clock] *timing* signals external to said oscillating means, wherein [at least one of] said plurality of [clock] *timing* signals [is] *are* coupled to a *plurality of* timing [circuit] *circuits,* said second control means independent of said first control means.

6. A circuit for providing a variable frequency oscillator (VFO) comprising:

a voltage controlled oscillator (VCO) having a center frequency established by a timing current, said VCO outputting a first clock signal dependent on a timing voltage swing;

first control means coupled to said VCO and to a control voltage, said first control means for setting said timing voltage swing, said timing voltage swing dependent on said control voltage;

second control means coupled to said VCO, said second control means for setting said timing current for establishing said center frequency, said second control means outputting a plurality of timing signals external to said VCO, wherein [at least one of] said plurality of timing signals [is] *are* coupled to a *plurality of* timing [circuit] *circuits.*

* * * * *